(12) United States Patent
Kwack et al.

(10) Patent No.: US 12,514,058 B2
(45) Date of Patent: Dec. 30, 2025

(54) DISPLAY DEVICE

(71) Applicant: Samsung Display Co., LTD., Yongin-si (KR)

(72) Inventors: Jin Ho Kwack, Yongin-si (KR); Je Won Yoo, Yongin-si (KR); Chang Mok Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 390 days.

(21) Appl. No.: 18/205,142

(22) Filed: Jun. 2, 2023

(65) Prior Publication Data

US 2024/0081093 A1 Mar. 7, 2024

(30) Foreign Application Priority Data

Aug. 19, 2022 (KR) .................. 10-2022-0103685

(51) Int. Cl.
*H10K 50/844* (2023.01)
*H10K 59/40* (2023.01)
*H10K 59/80* (2023.01)
*H10K 85/60* (2023.01)
*H10K 102/00* (2023.01)

(52) U.S. Cl.
CPC ......... *H10K 50/844* (2023.02); *H10K 59/873* (2023.02); *H10K 85/653* (2023.02); *H10K 59/40* (2023.02); *H10K 2102/351* (2023.02)

(58) Field of Classification Search
CPC ............. H10K 50/844; H10K 50/8445; H10K 59/873; H10K 59/8731
See application file for complete search history.

(56) References Cited

FOREIGN PATENT DOCUMENTS

KR  1020200099537  8/2020
KR  102343390  12/2021

*Primary Examiner* — Amar Movva
(74) *Attorney, Agent, or Firm* — CANTOR COLBURN LLP

(57) ABSTRACT

A display device includes a substrate, a first electrode disposed on the substrate, an organic light-emitting layer disposed on the first electrode, a second electrode disposed on the organic light-emitting layer, an encapsulation layer disposed on the second electrode, and a touch layer disposed on the encapsulation layer. The encapsulation layer includes a first inorganic layer, a first organic layer, a second organic layer, and a second inorganic layer. The first inorganic layer is disposed on the second electrode, the first organic layer is disposed on the first inorganic layer, the second organic layer is disposed on the first organic layer and has a greater ring parameter than the first organic layer, and the second inorganic layer is disposed on the second organic layer.

20 Claims, 11 Drawing Sheets

DISPLAY DEVICE

This application claims priority to Korean Patent Application No. 10-2022-0103685, filed on Aug. 19, 2022, and all the benefits accruing therefrom under 35 U.S.C. § 119, the content of which in its entirety is herein incorporated by reference.

BACKGROUND

1. Field

The present disclosure relates to a display device.

2. Description of the Related Art

As the information society has developed, the demand for a display device for displaying images has diversified. For example, the display device has been applied to various electronic devices such as smart phones, digital cameras, notebook computers, navigation systems, and smart televisions.

Here, the display device may be a flat panel display device such as a liquid crystal display ("LCD") device, a field emission display ("FED") device, or a light-emitting display device. Examples of the light-emitting display device include an organic light-emitting display device including organic light-emitting elements, an inorganic light-emitting display device including inorganic light-emitting elements such as inorganic semiconductors, and a micro- or nano-light-emitting display device including micro- or nano-light-emitting elements.

The display device may include an encapsulation layer including an inorganic layer and an organic layer, to seal the elements of the display device. However, the organic layer may be damaged during the formation of the inorganic layer on the organic layer, causing the degradation of the display quality of the display device.

SUMMARY

Aspects of the present disclosure provide a display device capable of improving display quality.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a display device includes: a substrate, a first electrode disposed on the substrate, an organic light-emitting layer disposed on the first electrode, a second electrode disposed on the organic light-emitting layer, an encapsulation layer disposed on the second electrode, and a touch layer disposed on the encapsulation layer. The encapsulation layer includes a first inorganic layer, a first organic layer, a second organic layer, and a second inorganic layer. The first inorganic layer is disposed on the second electrode, the first organic layer is disposed on the first inorganic layer, the second organic layer is disposed on the first organic layer and has a greater ring parameter than the first organic layer, and the second inorganic layer is disposed on the second organic layer.

In an embodiment, the second organic layer may have a ring parameter of 0.15 or greater, and the first organic layer may have a ring parameter less than 0.15.

In an embodiment, the second organic layer may have a greater dielectric constant than the first organic layer.

In an embodiment, the first organic layer may have a dielectric constant of 2.0 to 3.0, and the second organic layer may have a dielectric constant greater than 3.0.

In an embodiment, a thickness of the second organic layer may be 1% to 100% of a thickness of the first organic layer.

In an embodiment, the first organic layer may have a thickness of 1 micrometer (μm) to 10 μm, and the second organic layer may have a thickness of 0.01 μm to 10 μm.

In an embodiment, a bottom surface of the second organic layer may be in contact with a top surface of the first organic layer, and a top surface of the second organic layer may be in contact with a bottom surface of the second inorganic layer.

In an embodiment, the second organic layer may include a compound expressed by Formula 1:

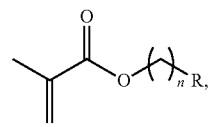

where n is a natural number of 4 or greater, and R is a phenyl or phenoxy group.

In an embodiment, the compound may include 2-phenoxyethyl acrylate.

According to an aspect of the present disclosure, a display device includes: a substrate, a first electrode disposed on the substrate, an organic light-emitting layer disposed on the first electrode, a second electrode disposed on the organic light-emitting layer, and an encapsulation layer disposed on the second electrode. The encapsulation layer includes a first organic layer, a second organic layer, and a first inorganic layer. The second organic layer is disposed between the first organic layer and the inorganic layer, and the second organic layer includes a compound expressed by Formula 1:

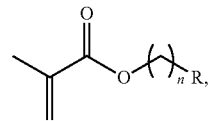

where n is a natural number of 4 or greater, and R is a phenyl or phenoxy group.

In an embodiment, the compound may include 2-phenoxyethyl acrylate.

In an embodiment, the second organic layer may have a greater ring parameter than the first organic layer.

In an embodiment, the second organic layer may have a ring parameter of 0.15 or greater, and the first organic layer may have a ring parameter less than 0.15.

In an embodiment, the second organic layer may have a greater dielectric constant than the first organic layer.

In an embodiment, the first organic layer may have a dielectric constant of 2.0 to 3.0, and the second organic layer may have a dielectric constant greater than 3.0.

In an embodiment, a thickness of the second organic layer may be 1% to 100% of a thickness of the first organic layer.

In an embodiment, the first organic layer may have a thickness of 1 μm to 10 μm, and the second organic layer may have a thickness of 0.01 μm to 10 μm.

In an embodiment, a bottom surface of the second organic layer may be in contact with a top surface of the first organic layer, and a top surface of the second organic layer may be in contact with a bottom surface of the inorganic layer.

According to an aspect of the present disclosure, a display device includes a substrate, a first electrode disposed on the substrate, an organic light-emitting layer disposed on the first electrode, a second electrode disposed on the organic light-emitting layer, and an encapsulation layer disposed on the second electrode. The encapsulation layer includes a first organic layer, a second organic layer, and an inorganic layer. The second organic layer is disposed between the first organic layer and the inorganic layer, the second organic layer has a greater dielectric constant than the first organic layer, and the second organic layer has a dielectric constant greater than 3.0.

In an embodiment, the first organic layer may have a dielectric constant of 2.0 to 3.0.

According to the aforementioned and other embodiments of the present disclosure, plasma resistance can be secured by forming a second organic layer having a large ring parameter. Accordingly, a first organic layer can be prevented from being damaged by plasma during the formation of a second inorganic layer, and as a result, the degradation of display quality such as dark-spot defects can be effectively prevented.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Embodiments of the present disclosure will hereinafter be described with reference to the attached drawings.

Figure 1:
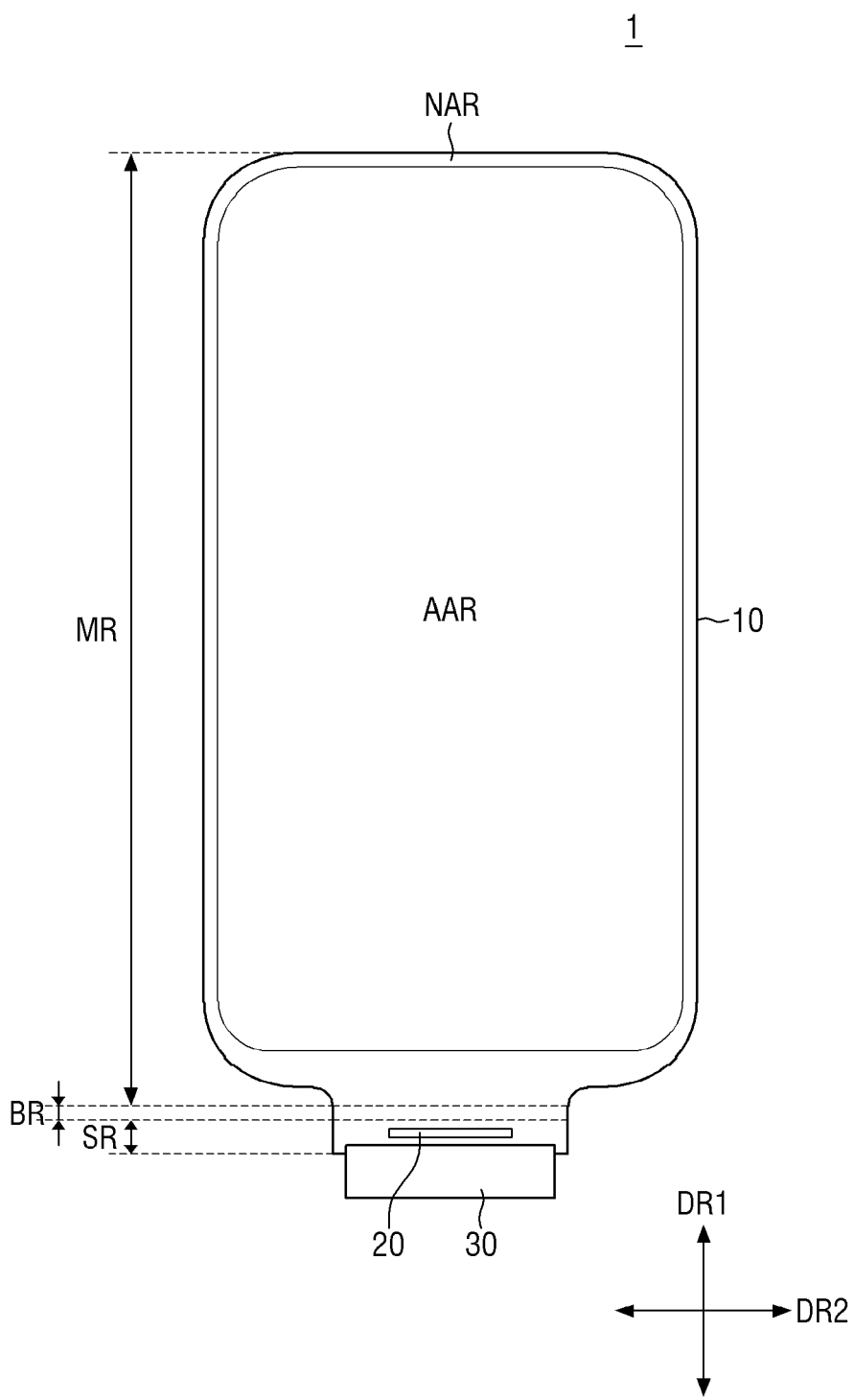
FIG. 1 is a plan view of a display device according to an embodiment of the present disclosure.
Figure 2:
FIG. 2 is a cross-sectional view of the display device according to an embodiment of the present disclosure.

FIG. 1 is a plan view of a display device according to an embodiment of the present disclosure. FIG. 2 is a cross-sectional view of the display device according to an embodiment of the present disclosure.

First and second directions DR1 and DR2 are different directions and intersect each other. For convenience, referring to FIG. 1, the first direction DR1 is defined as a vertical direction, and the second direction DR2 is defined as a horizontal direction. As used herein, the "plan view" is a view from a third direction DR3 (i.e., thickness direction of the display panel 10). The third direction DR3 is perpendicular to the first direction DR1 and the second direction DR2. In a plan view, one side or a first side in the first direction DR1 may refer to, but is not limited to, an upper side, the other side or a second side in the first direction DR1 may refer to, but is not limited to, a lower side, one side or a first side in the second direction DR2 may refer to, but is not limited to, a right side, and the other side or a second side in the second direction DR2 may refer to, but is not limited to, a left side.

Referring to FIGS. 1 and 2, a display device 1 may refer to nearly all types of electronic devices that provide a display screen. Examples of the display device 1 include not only portable electronic devices such as a mobile phone, a smartphone, a tablet personal computer ("PC"), an electronic watch, a watchphone, a mobile communication terminal, an electronic notepad, an electronic book reader, a portable multimedia player ("PMP"), a navigation device, a gaming console, a digital camera, and the like, but also a television ("TV"), a notebook computer, an electronic billboard, an Internet-of-Things ("IoT") device, and the like.

The display device 1 includes an active region AAR and a nonactive region NAR. If portion of the display device 1 that displays a screen is defined as a display area, portion of the display device 1 that does not display a scree is defined as a non-display area, and portion of the display device 1 where the sensing of touch input is performed is defined as a touch area, the display area and the touch area may be included in the active region AAR. The display area and the touch area may overlap in a plan view. That is, the active region AAR may be a region where the display of an image and the sensing of touch input are both performed.

The active region AAR may have a rectangular shape with right-angled or rounded corners. The active region AAR is illustrated as having a rectangular shape that extends longer in the first direction DR1 than in the second direction DR2 with rounded corners, but the present disclosure is not limited thereto. Alternatively, the active region AAR may have various other shapes such as a rectangular shape extending longer in the second direction DR2 than in the first direction DR1, a square shape, another polygonal shape, a circular shape, or an elliptical shape.

The nonactive region NAR may be disposed around the active region AAR. The nonactive region NAR may be a bezel area. The nonactive region NAR may surround all the sides (i.e., four sides) of the active region AAR, but the present disclosure is not limited thereto. Alternatively, the nonactive region NAR may not be disposed on the upper side of the active region AAR or on the left and right sides of the active region AAR.

Signal lines for applying signals to the nonactive region NAR or driving circuits may be disposed in the nonactive region NAR. The nonactive region NAR may not include the display area. The nonactive region NAR may also not include the touch area. Alternatively, the nonactive region NAR may include portion of the touch area, and sensors such as pressure sensors may be disposed in the portion of the touch area in the nonactive region NAR. In some embodiments, the active region AAR may completely coincide with the display area, and the nonactive region NAR may completely coincide with the non-display area.

The display device 1 includes a display panel 10, which provides a display screen. The display panel 10 may be, for example, an organic light-emitting display panel, a micro-light-emitting diode ("LED") display panel, a nano-LED display panel, a quantum-dot LED display panel, a liquid crystal display panel, a plasma display panel ("PDP"), a field emission display (FED) panel, an electrophoretic display ("EPD") panel, or an electrowetting display panel. The display panel 10 will hereinafter be described as being, for example, an organic light-emitting display panel, but the present disclosure is not limited thereto. Obviously, various other display panels may also be applicable to the display device 1.

The display panel 10 may include a plurality of pixels. The pixels may be arranged in row and column directions. The pixels may have a rectangular or square shape in a plan view, but the present disclosure is not limited thereto. Alternatively, the pixels may have a rhombus shape with sides at an inclination with respect to the first direction DR1. Each of the pixels may include an emission area. Emission areas of the pixels may have the same shape as, or a different shape from, the pixels. For example, in a case where the pixels have a rectangular shape, the emission areas of the pixels may have various shapes such as a rectangular, rhombus, hexagonal, octagonal, or circular shape. The pixels and the emission areas of the pixels will be described later.

The display device 1 may further include a touch member capable of sensing touch input. The touch member may be provided as a separate panel or film from the display panel 10 and may be attached on the display panel 10. Alternatively, the touch member may be provided in the display panel 10 as a touch layer. The touch member will hereinafter be described as being provided in the display panel 10, but the present disclosure is not limited thereto.

The display panel 10 may include a flexible substrate including a flexible polymer material such as polyimide ("PI"). Accordingly, the display panel 10 may be bendable, foldable, or rollable.

The display panel 10 may include a bending region BR. The display panel 10 may be divided into a main region MR, which is disposed on one side of the bending region BR, and a subregion SR, which is disposed on the other side of the bending region BR.

The display area of the display panel 10 may be disposed in the main region MR. A peripheral edge area around the display area, the entire bending region BR, and the entire subarea SR may correspond to the non-display area, but the present disclosure is not limited thereto. Alternatively, the bending region BR and/or the subregion SR may also include the display area.

The bending region BR may be connected to a first side, in the first direction DR1, of the main region MR. For example, the bending region BR may be connected to the lower short side of the main region MR. The width of the bending region BR may be less than the width of the main region MR (or the length of the short sides of the main region MR). Portion of the main region MR connected to the bending region BR may have an L shape in a plan view.

The display panel 10 may be bent downwardly in a thickness direction, i.e., in the opposite direction of a display surface, in the bending region BR. The bending region BR may have a uniform curvature radius, but the present disclosure is not limited thereto. Alternatively, the bending region BR may have different curvature radiuses from one location to another location. As the display panel 10 is bendable in the bending region BR, the surfaces of the display panel 10 may be reversed. That is, as the display panel 10 is bent in the bending region BR, a surface of the display panel 10 that faces upward may turn outward and then downward.

The subregion SR may extend from the bending region BR. When the bending of the display panel 10 is complete, the subregion SR may be able to extend in parallel to the main region MR. The subregion SR may overlap with the main region MR in the thickness direction (i.e., third direction DR3) of the display panel 10. The width, in the second direction DR2, of the subregion SR may be the same as the width, in the second direction DR2, of the bending region BR, but the present disclosure is not limited thereto.

A driving chip 20 may be disposed in the subregion SR. The driving chip 20 may include integrated circuits ("IC") for driving the display panel 10. The ICs may include an IC for display and/or an IC for a touch unit. The IC for display and the IC for a touch unit may be provided as separate chips or may be incorporated into a single chip.

A pad unit (not illustrated) may be disposed at the end of the subregion SR of the display panel 10. The pad unit may include a plurality of display signal line pads and a plurality of touch signal line pads. A driving substrate FPC may be connected to the pad unit at the end of the subregion SR. The driving substrate FPC may be a flexible printed circuit board ("FPCB") or a film.

Figure 3:
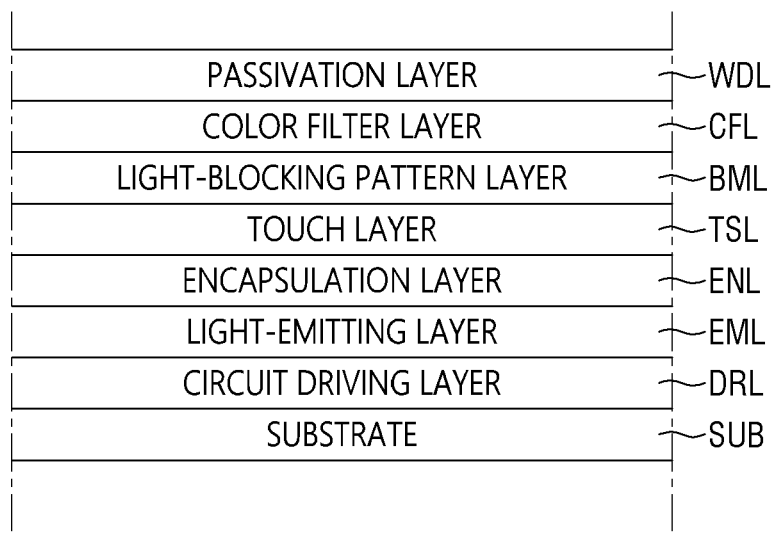
FIG. 3 is a cross-sectional view of a display panel according to an embodiment of the present disclosure.

FIG. 3 is a cross-sectional view of a display panel according to an embodiment of the present disclosure.

Referring to FIG. 3, the display panel 10 may include a circuit driving layer DRL, which is disposed on a substrate SUB. The circuit driving layer DRL may include a circuit for driving a light-emitting layer EML of the pixels. The circuit driving layer DRL may include a plurality of thin-film transistors ("TFTs").

The light-emitting layer EML may be disposed on the circuit driving layer DRL. The light-emitting layer EML may include an organic light-emitting layer. The light-emitting layer EML may emit light at various luminances in response to driving signals transmitted thereto from the circuit driving layer DRL.

An encapsulation layer ENL may be disposed on the light-emitting layer EML. The encapsulation layer ENL may include an inorganic film or a stack of an inorganic film and an organic film. Alternatively, glass or an encapsulation film may be provided as the encapsulation layer ENL.

A touch layer TSL may be disposed on the encapsulation layer ENL. The touch layer TSL, which is a layer capable of sensing touch input, may function as the touch member. The touch layer TSL may include a plurality of sensing areas and sensing electrodes.

A light-blocking pattern layer BML may be disposed on the touch layer TSL. The light-blocking pattern layer BML may reduce the reflection of external light and improve reflection colors.

A color filter layer CFL may be disposed on the light-blocking pattern layer BML. The color filter layer CFL may reduce the reflection of external light. The color filter layer CFL may include color filters such as red color filters, green color filters, and blue color filters. The color filters may be disposed in the pixels. The color filters may improve the color purity of light emitted from the emission areas of the pixels. FIG. 3 illustrates that the color filter layer CFL and the light-blocking pattern layer BML are separate from each other, but the present disclosure is not limited thereto. Alternatively, the light-blocking pattern layer BML may be included in the color filter layer CFL. For example, the light-blocking pattern layer BML may include light-blocking patterns, which are disposed between the color filters, and the color filter layer CFL may also include the light-blocking patterns.

As the color filter layer CFL is disposed on the light-blocking pattern layer BML to reduce the reflection of external light, the front transmittance of light emitted from the light-emitting layer EML can be improved, as compared to a case where a polarizing member is disposed on the light-blocking pattern layer BML.

A passivation layer WDL may be disposed on the color filter layer CFL. The passivation layer WDL may include, for example, a window member. The passivation layer WDL may be attached to the color filter layer CFL via, for example, an optically transparent adhesive.

The touch member will hereinafter be described.

Figure 4:
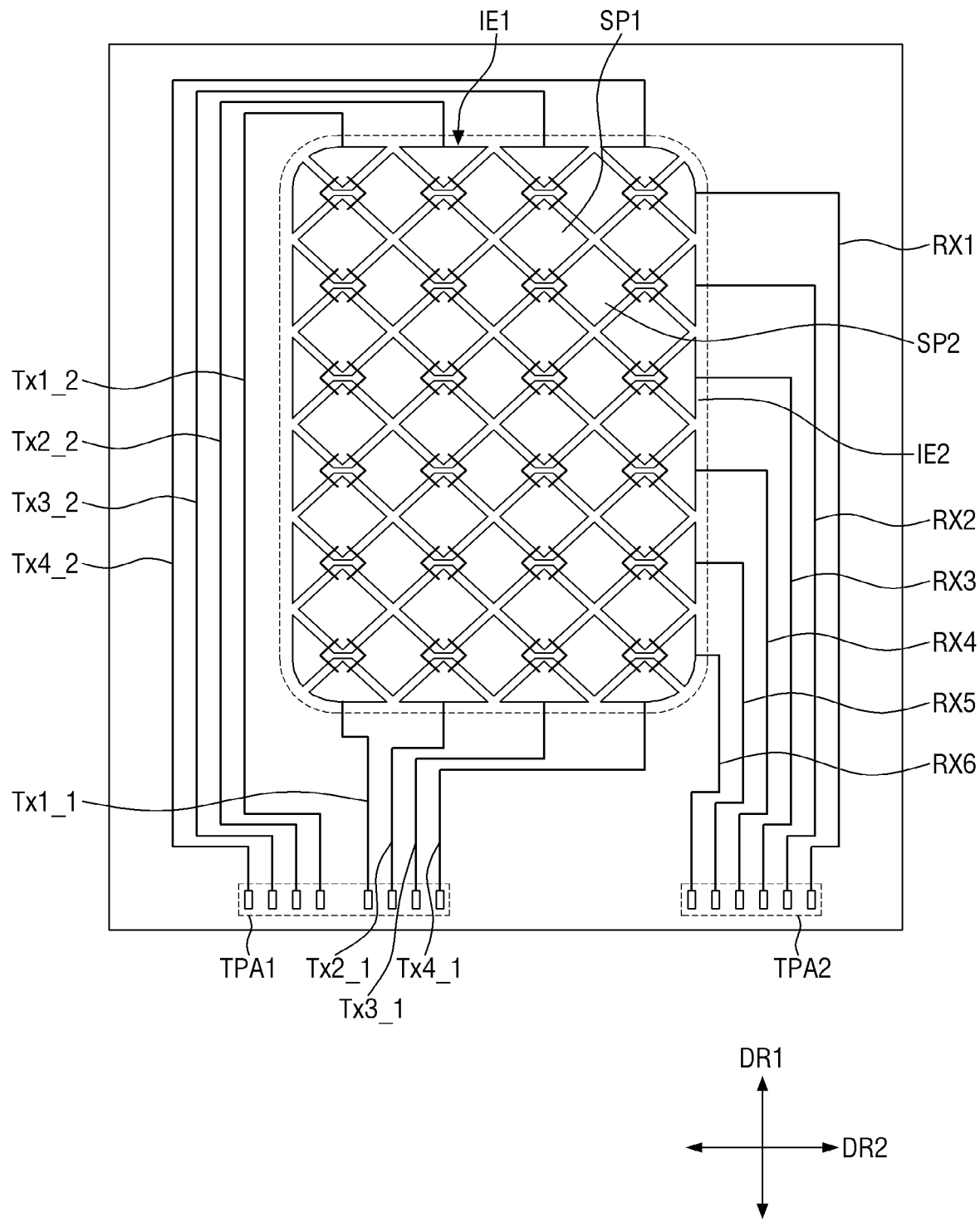
FIG. 4 is a layout view of a touch member according to an embodiment of the present disclosure.
Figure 5:
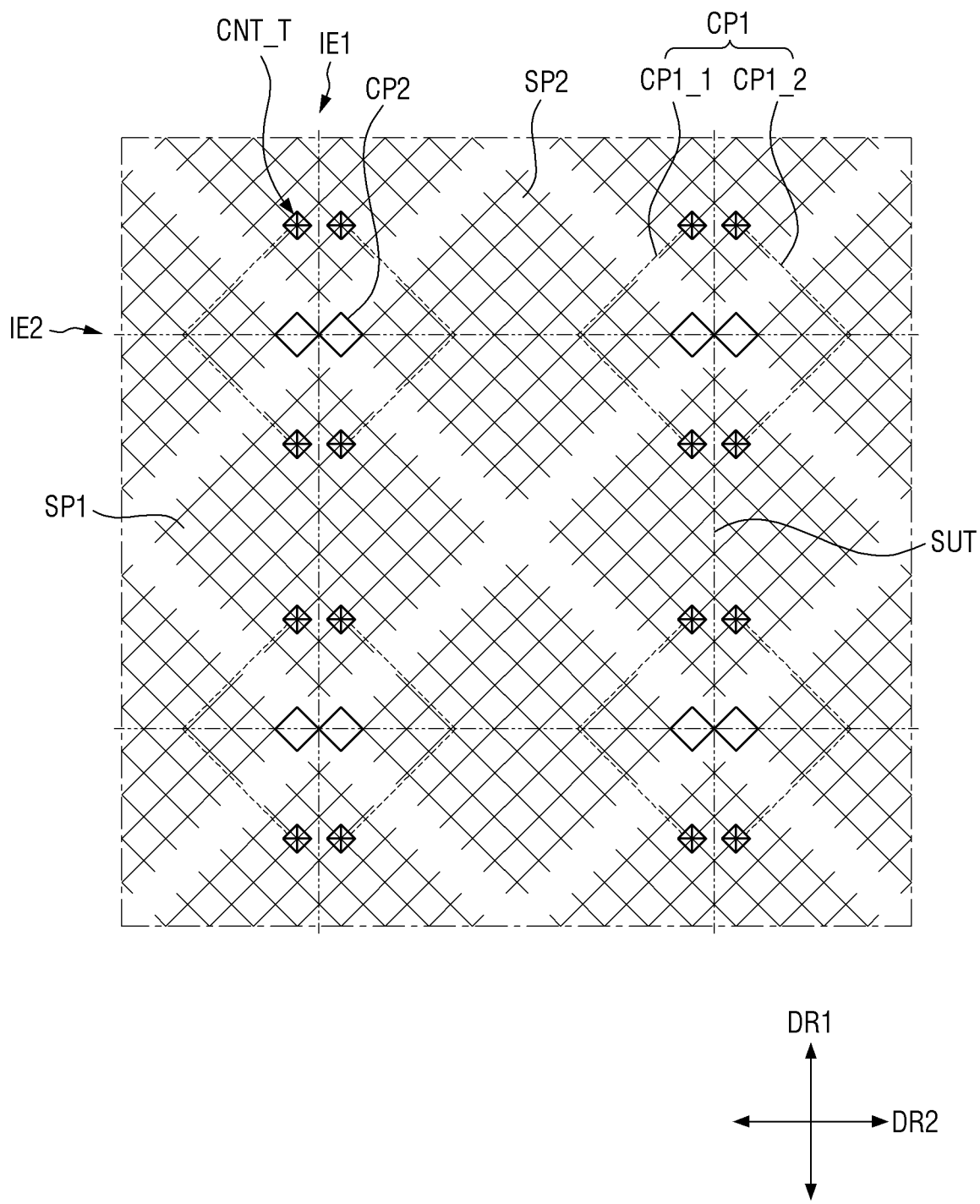
FIG. 5 is an enlarged layout view of portion of a touch area of FIG. 4.

FIG. 4 is a layout view of a touch member according to an embodiment of the present disclosure. FIG. 5 is an enlarged layout view of portion of a touch area of FIG. 4.

Referring to FIGS. 4 and 5, the touch member may include a touch area, which is positioned in the active region AAR, and a non-touch area, which is disposed in the nonactive region NAR. For convenience, FIG. 4 schematically illustrates the shape of the touch member and illustrates the non-touch area larger than it may actually be, but the touch area and the non-touch area may have substantially the same shapes as the active region AAR and the nonactive region NAR, respectively.

The touch area of the touch member may include a plurality of first detection electrodes IE1 (or first touch electrodes) and a plurality of second detection electrodes IE2 (or second touch electrodes). The first detection electrodes IE1 may be driving electrodes, and the second detection electrodes IE2 may be sensing electrodes. Alternatively, the first detection electrodes IE1 may be sensing electrodes, and the second detection electrodes IE2 may be driving electrodes. The first detection electrodes IE1 will hereinafter be described as being driving electrodes, and the second detection electrodes IE2 will hereinafter be described as being sensing electrodes.

The first detection electrodes IE1 may extend in the first direction DR1. Each of the first detection electrodes IE1 may include a plurality of first sensor parts SP1, which are arranged along the first direction DR1, and first connecting parts CP1, which electrically connect the first sensor parts SP1.

The first detection electrodes IE1 may be arranged along the second direction DR2.

The second detection electrodes IE2 may extend in the second direction DR2. Each of the second detection electrodes IE2 may include a plurality of second sensor parts SP2, which are arranged along the second direction DR2, and second connecting parts CP2, which electrically connect the second sensor parts SP2. The second detection electrodes IE2 may be arranged along the first direction DR1.

FIG. 4 illustrates four first detection electrodes IE1 and six second detection electrodes IE2 are provided, but the present disclosure is not limited thereto. That is, the numbers of first detection electrodes IE1 and second detection electrodes IE2 are not particularly limited.

At least some of the first sensor parts SP1 and at least some of the second sensor parts SP2 may have a rhombus shape. Some of the first sensor parts SP1 and some of the second sensor parts SP2 may have a shape obtained by cutting a rhombus shape. For example, all the first sensor parts SP1 and the second sensor parts SP2, except for those at the ends of the touch member, may have a rhombus shape, and first sensor parts SP1 and second sensor parts SP2 at the ends of the touch member may have a triangular shape obtained by cutting the rhombus shape in halves. Rhombic first sensor parts SP1 and rhombic second sensor parts SP2 may have substantially the same size and shape. However, the present disclosure is not limited to this. The shape and size of the first sensor parts SP1 and the second sensor parts SP2 may vary.

Figure 7:
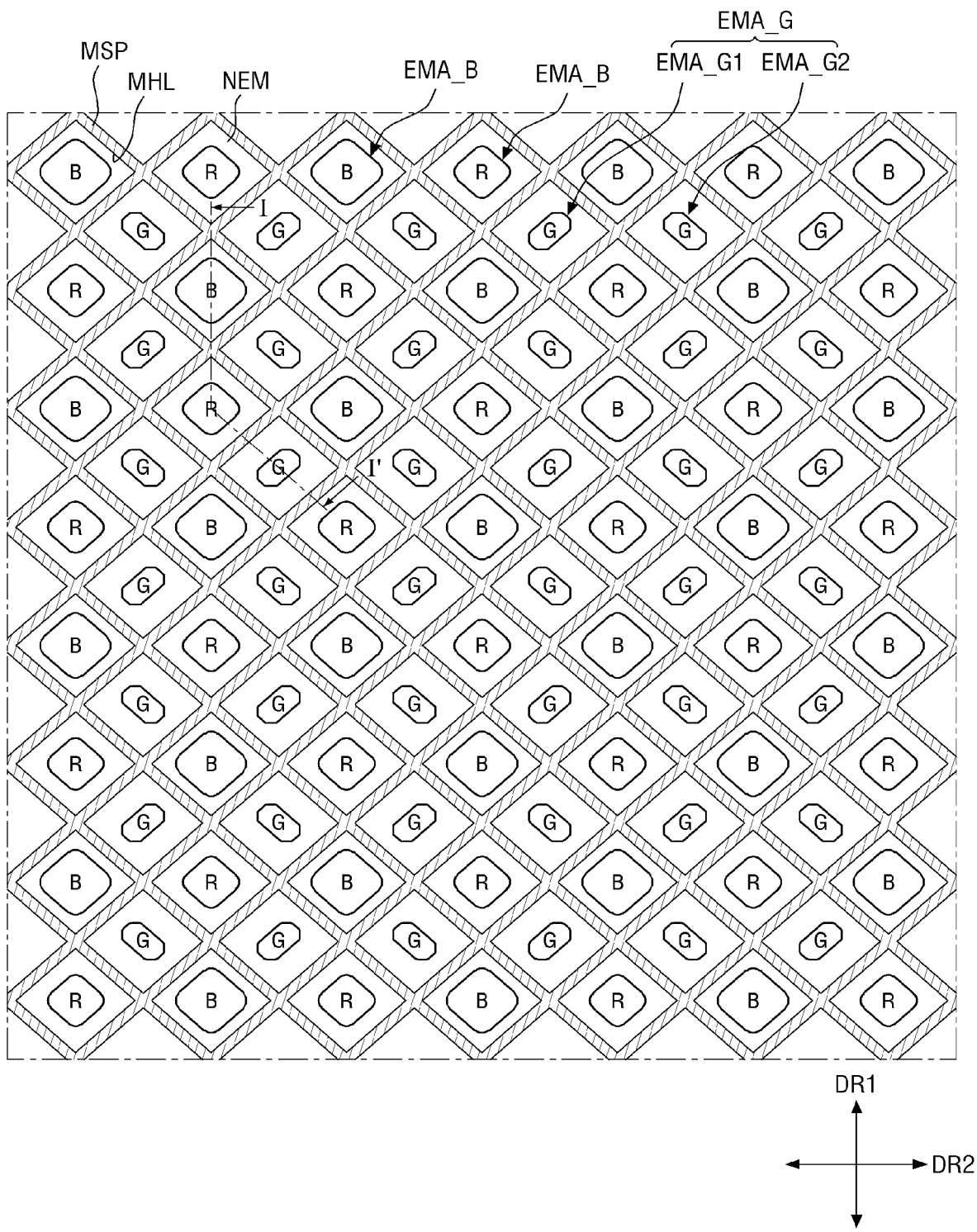
FIG. 7 is a layout view illustrating how pixels of a display area and mesh patterns of the touch member are arranged in the display device according to an embodiment of the present disclosure.

The first sensor parts SP1 of the first detection electrodes IE1 and the second sensor parts SP2 of the second detection electrodes IE2 may include surface patterns or mesh patterns. In a case where the first sensor parts SP1 and the second sensor parts SP2 include surface patterns, the first sensor parts SP1 and the second sensor parts SP2 may consist of a transparent conductive layer. In a case where the first sensor parts SP1 and the second sensor parts SP2 include mesh patterns along the non-emission area NEM, as illustrated in FIGS. 5 and 7, the first sensor parts SP1 and the second sensor parts SP2 may not interfere with the travel of light, even if the first sensor parts SP1 and the second sensor parts SP2 are formed of or include an opaque low-resistance metal. The first sensor parts SP1 and the second sensor parts SP2 will hereinafter be described as including mesh patterns, but the present disclosure is not limited thereto.

The first connecting parts CP1 may connect corners of the first sensor parts SP1 to one another. The second connecting parts CP2 may connect corners of the second sensor parts SP2 to one another. The first connecting parts CP1 and the second connecting parts CP2 may have a smaller width than the first sensor parts SP1 and the second sensor parts SP2.

The first detection electrodes IE1 and the second detection electrodes IE2 may be insulated from one another while intersecting one another. Insulation between the first detection electrodes IE1 and the second detection electrodes IE2 may be secured by connecting the first detection electrodes IE1 and the second detection electrodes IE2 via different conductive layers, at the intersections between the first detection electrodes IE1 and the second detection electrodes IE2. The first detection electrodes IE1 and the second detection electrodes IE2 may be insulated from one another while intersecting one another, via the first connecting parts CP1 and/or the second connecting parts CP2. The first connecting parts CP1 and/or the second connecting parts CP2 may be positioned in a different layer from the first detection electrodes IE1 and the second detection electrodes IE2 to insulate the first detection electrodes IE1 and the second detection electrodes IE2 from one another while allowing first detection electrodes IE1 and the second detection electrodes IE2 to intersect one another.

For example, the first sensor parts SP1 of the first detection electrodes IE1 and the second sensor parts SP2 of the second detection electrodes IE2 may be formed of or include conductive layers on the same level, and the first sensor parts SP1 and the second sensor parts SP2 may neither intersect nor overlap with one another in a plan view. The first sensor parts SP1 and the second sensor parts SP2 may be physically isolated from one another.

The second connecting parts CP2 may be formed of or include the same conductive layer as the second sensor parts SP2 to connect the second sensor parts SP2. The first sensor parts SP1 may be physically spaced apart from one another with the second connecting parts CP2 interposed therebetween. The first connecting parts CP1, which connect the first sensor parts SP1, may be formed of or include a different conductive layer from the first sensor parts SP1 to extend across the second detection electrodes IE2. The first connecting parts CP1 may be electrically connected to the first sensor parts SP1 via contacts.

A plurality of first connecting parts CP1 may be provided. For example, one first connecting part CP1 may include a (1-1)-th connecting part CP1_1, which overlaps with, and extends across, a second detection electrode IE2 on a first side of a corresponding first connecting part CP1, and a (1-2)-th connecting part CP1_2, which overlaps with, and extends across, a second detection electrode IE2 on a second side of the corresponding first connecting part CP1. As each pair of adjacent first sensor parts SP1 of each of the first detection electrodes IE1 is connected by multiple first connecting parts CP1, each of the first detection electrodes IE1 can be prevented from being disconnected, even if one of the multiple first connecting parts CP1 is disconnected by, for example, static electricity.

The first sensor parts SP1 and the second sensor parts SP2 may form unit sensing areas SUT. For example, the halves of two adjacent first sensor parts SP1 and the halves of two adjacent second sensor parts SP2 at the intersection between one first detection electrode IE1 and one second detection electrode IE2 may form a square or a rectangular area together. In this example, the square or rectangular area may be defined as a unit sensing area SUT. A plurality of unit sensing areas SUT may be arranged in the row and column directions.

The presence of touch input may be determined and the touch coordinates of the touch input may be calculated by measuring the capacitance between the first sensor parts SP1 and the second sensor parts SP2 from each of the unit sensing areas SUT. The detection of touch input may be performed in a mutual capacitance manner, but the present disclosure is not limited thereto. The detection of touch input will hereinafter be described as being performed in the mutual capacitance manner.

Touch sensitivity detected from each of the unit sensing areas SUT may be proportional to the capacitance between the first sensor parts SP1 and the second sensor parts SP2 in each of the unit sensing areas SUT and may be inversely proportional to the capacitance between the first sensor parts SP1/the second sensor parts SP2 in each of the unit sensing areas SUT and conductive layers below the second touch conductive layer 220 (of FIG. 6). The capacitance between the first sensor parts SP1/the second sensor parts SP2 in each of the unit sensing areas SUT and the conductive layers below the second touch conductive layer 220 may be proportional to touch sensitivity noise. The capacitance between the first sensor parts SP1/the second sensor parts SP2 in each of the unit sensing areas SUT and the conductive layers below the second touch conductive layer 220 may also be referred to as base capacitance. To raise touch sensitivity in each of the unit sensing areas SUT, not the capacitance between the first sensor parts SP1 and the second sensor parts SP2 in each of the unit sensing areas SUT, but the touch sensitivity noise (or base capacitance) of each of the unit sensing areas SUT may be lowered, and this will be described later.

The unit sensing areas SUT may be larger than the pixels. For example, each of the unit sensing areas SUT may correspond to multiple pixels. The unit sensing areas SUT may have a length of 4 mm to 5 mm, but the present disclosure is not limited thereto.

A plurality of touch signal lines may be disposed in the nonactive region NAR on the outside of the touch area. The touch signal lines may extend from touch pad units TPA1 and TPA2, which are positioned in the subregion SR, to the nonactive region NAR of the main region MR through the bending region BR.

The touch signal lines include a plurality of touch driving lines TX and a plurality of touch sensing lines RX.

The touch driving lines TX are connected to the first detection electrodes TEL Multiple touch driving lines TX may be connected to one first detection electrode IE1. For example, the touch driving lines TX may include first touch driving lines TX1_1, TX2_1, TX3_1, and TX4_1, which are connected to the lower ends of the first detection electrodes IE1, and second touch driving lines TX1_2, TX2_2, TX3_2, and TX4_2, which are connected to the upper ends of the first detection electrodes IE1. The first touch driving lines TX1_1, TX2_1, TX3_1, and TX4_1 may extend from the touch signal line pad unit TPA1 in the first direction DR1 and may be connected to the lower ends of the first detection electrode IE1. The second touch driving lines TX1_2, TX2_2, TX3_2, and TX4_2 may extend from the touch signal line pad unit TPA1 in the first direction DR1, passing through a left edge portion of the touch area, and may be connected to the upper ends of the first detection electrode IE1

The touch sensing lines RX may be connected to the second detection electrodes IE2. One touch sensing line RX may be connected to one second detection electrode IE2. The touch sensing lines RX may extend from the touch signal line pad unit TPA2 in the first direction DR1, passing through a right edge portion of the touch area, and may be connected to the right ends of the second detection electrodes IE2.

Figure 6:
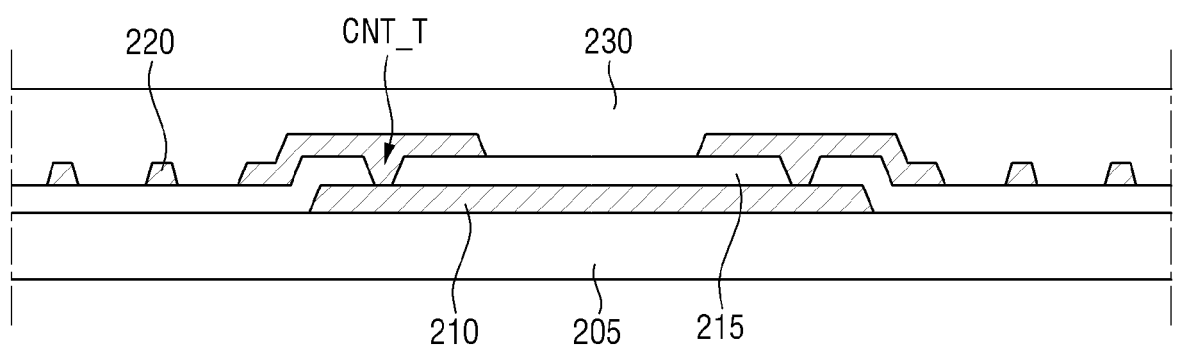
FIG. 6 is a cross-sectional view illustrating first and second touch conductive layers of FIG. 5 and a contact hole between the first and second touch conductive layers.

FIG. 6 is a cross-sectional view illustrating first and second touch conductive layers of FIG. 5 and a contact hole between the first and second touch conductive layers.

Referring to FIG. 6 and further to FIGS. 4 and 5, the touch member may include a base layer 205, a first touch conductive layer 210 on the base layer 205, a first touch insulating layer 215 on the first touch conductive layer 210, a second touch conductive layer 220 on the first touch insulating layer 215, and a second touch insulating layer 230 covering the second touch conductive layer 220.

Specifically, the first touch conductive layer 210 is disposed on the base layer 205. The first touch conductive layer 210 is covered by the first touch insulating layer 215. The first touch insulating layer 215 insulates the first and second touch conductive layers 210 and 220. The second touch conductive layer 220 is disposed on the first touch insulating layer 215. The second touch insulating layer 230 covers and protects the second touch conductive layer 220.

The base layer 205 may include an inorganic insulating material. For example, the base layer 205 may include a silicon nitride layer, a silicon oxynitride layer, a silicon oxide layer, a titanium oxide layer, or an aluminum oxide layer. In some embodiments, the base layer 205 may be replaced with a second inorganic layer 194 of an encapsulation layer 190.

Each of the first and second touch conductive layers 210 and 220 may include a metal or a transparent conductive layer. The metal may be aluminum (Al), titanium (Ti), copper (Cu), molybdenum (Mo), silver (Ag), or an alloy thereof. The transparent conductive layer may include a transparent conductive oxide such as indium tin oxide ("ITO"), indium zinc oxide ("IZO"), zinc oxide (ZnO), or indium tin zinc oxide ("ITZO"), a conductive polymer such as poly(3,4-ethylenedioxythiophene) ("PEDOT"), metal nanowires, or graphene. As already mentioned above, in a case where the first and second touch conductive layers 210 and 220 are disposed in the non-emission area NEM, the first and second touch conductive layers 210 and 220 may not interfere with the travel of light, even if they are formed of or include a low-resistance opaque metal.

The first touch conductive layer 210 and/or the second touch conductive layer 220 may include a conductive multilayer. For example, the first touch conductive layer 210 and/or the second touch conductive layer 220 may have a triple-layer structure such as Ti/Al/Ti.

The first connecting parts CP1 may be formed of or include the first touch conductive layer 210, and the first sensor parts SP1, the second sensor parts SP2, and the second connecting parts CP2 may be formed of or include the second touch conductive layer 220. However, the present disclosure is not limited to this. Alternatively, the first connecting parts CP1 may be formed of or include the second touch conductive layer 220, and the first sensor parts SP1, the second sensor parts SP2, and the second connecting parts CP2 may be formed of or include the first touch conductive layer 210. The touch signal lines may be formed of or include the first touch conductive layer 210, the second touch conductive layer 220, or the first and second touch conductive layers 210 and 220 connected via contacts. Touch conductive layers that form the first detection electrodes IE1, the second detection electrodes IE2, and other signal lines may be modified in various manners.

The first and second touch insulating layers 215 and 230 may include an inorganic material or an organic material. One of the first and second touch insulating layers 215 and 230 may include an inorganic material, and the other touch insulating layer may include an organic material. The first touch insulating layer 215 may include a silicon nitride layer, a silicon oxynitride layer, a silicon oxide layer, a titanium oxide layer, or an aluminum oxide layer, and the second touch insulating layer 230 may include at least one of an acrylic resin, a methacrylic resin, polyisoprene, a vinyl resin, an epoxy resin, a urethane resin, a cellulose resin, a siloxane resin, a polyimide resin, a polyamide resin, and a perylene resin.

The first touch insulating layer 215 may include a contact hole CNT_T. The first touch conductive layer 210 (e.g., the first connecting parts CP1) and the second touch conductive layer 220 (e.g., the first sensor parts SP1) may be electrically connected through the contact hole CNT_T.

FIG. 7 is a layout view illustrating how the pixels of the display area and mesh patterns of the touch member are arranged in the display device according to an embodiment of the present disclosure.

Referring to FIG. 7, the display area of the active region AAR includes a plurality of pixels. The pixels include emission areas (EMA_R, EMA_G, and EMA_B). The emission areas (EMA_R, EMA_G, and EMA_B) may overlap with openings of the bank layer 126 in a plan view and may be defined by the openings of the bank layer 126. The non-emission area NEM is disposed between the emission areas (EMA_R, EMA_G, and EMA_B). The non-emission area NEM may overlap with the bank layer 126 in a plan view and may thus be defined by the bank layer 126. The non-emission area NEM may surround the emission areas (EMA_R, EMA_G, and EMA_B). The non-emission area NEM may have a lattice or mesh shape in diagonal directions intersecting the first and second directions DR1 and DR2, in a plan view. Mesh patterns MSP may be disposed in the non-emission area NEM.

The pixels may include first-color pixels (e.g., red pixels), second-color pixels (e.g., blue pixels), and third-color pixels (e.g., green pixels). The emission areas (EMA_R, EMA_G, and EMA_B) may generally have an octagonal, rectangular, or rhombus shape with rounded corners, but the present disclosure is not limited thereto. Alternatively, the emission areas (EMA_R, EMA_G, and EMA_B) may have a circular shape or another polygonal shape with or without rounded corners.

First-color emission areas EMA_R of the first-color pixels and second-color emission areas EMA_B of the second-color pixels may have a similar shape, i.e., a rhombus shape with rounded corners. The second-color emission areas EMA_B may be larger than the first-color emission areas EMA_R.

Third-color emission areas EMA_G may be smaller than the first-color emission areas EMA_R. The third-color emission areas EMA_G may have an octagonal shape and may be inclined diagonally with respect to the first or second direction DR1 and DR2, having the largest width in a first or second diagonal direction. The third-color emission areas EMA_G include third-color emission areas EMA_G1 that are inclined in the first diagonal direction and third-color emission areas EMA_G2 that are inclined in the second diagonal direction.

The emission areas (EMA_R, EMA_G, and EMA_B) may be arranged in various manners. The first-color emission areas EMA_R and the second-color emission areas EMA_B may be alternately arranged along the second direction DR2, forming a first row, and the third-color emission areas EMA_G may be arranged along the second direction DR2 in a second row adjacent to the first row. The color emission areas EMA_G in the second row may be arranged in a staggered manner in the second direction DR2 with respect to the first-color emission areas EMA_R and the second-color emission areas EMA_B in the first row. In the second row, the third-color emission areas EMA G1 and the third-color emission areas EMA_G2 may be alternately arranged along the second direction DR2.

In a third row, the first-color emission areas EMA_R and the second-color emission areas EMA_B may be alternately arranged, but in the opposite order to that in the first row. That is, the second-color emission areas EMA_B may be arranged in the third row, in columns where the first-color emission areas EMA_R of the first row are arranged, and the first-color emission areas EMA_R may be arranged in the third row, in columns where the second-color emission areas EMA_B of the first row are arranged. In a fourth row, like in the second row, the third-color emission areas EMA_G may be arranged, but in the opposite order to that in the second row. That is, the third-color emission areas EMA_G2 may be arranged in the fourth row, in columns where the third-color emission areas EMA_G1 of the second row are arranged, and the third-color emission areas EMA_G1 may be arranged in the fourth row, in columns where the third-color emission areas EMA_G2 of the second row are arranged.

The first, second, third, and fourth rows may be repeated along the first direction DR1. The layout of the emission areas (EMA_R, EMA_G, and EMA_B) is not particularly limited.

The mesh patterns MSP may be disposed along the boundaries of each of the pixels in the non-emission area NEM. The mesh patterns MSP may not overlap with the emission areas (EMA_R, EMA_G, and EMA_B) in a plan view. The mesh patterns MSP may be positioned in the non-emission area NEM, in a plan view. Mesh holes MHL exposed by the mesh patterns MSP may substantially have a rhombus shape. The mesh holes MHL may have the same size or may have different sizes depending on, or regardless of, the size of the emission areas (EMA_R, EMA_G, and EMA_B) exposed by the mesh holes MHL. FIG. 7 illustrates that one mesh hole MHL corresponds to one emission area, but the present disclosure is not limited thereto. Alternatively, one mesh hole MHL may correspond to two or more emission areas.

Figure 8:
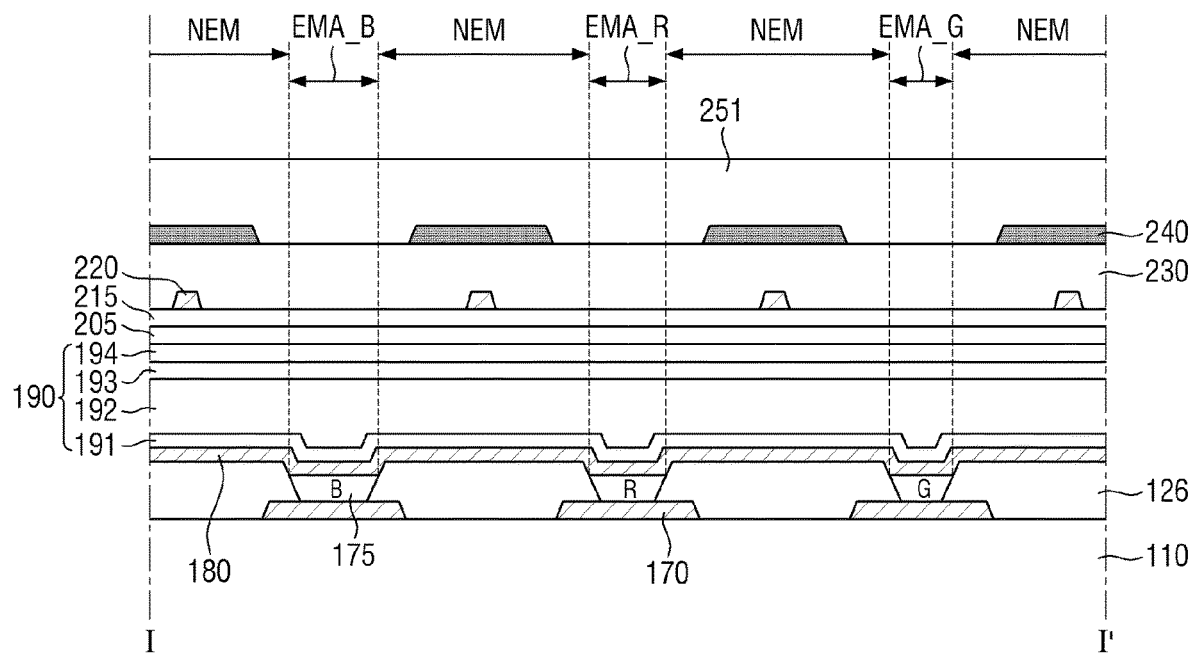
FIG. 8 is a cross-sectional view taken along line I-I' of FIG. 7.
Figure 9:
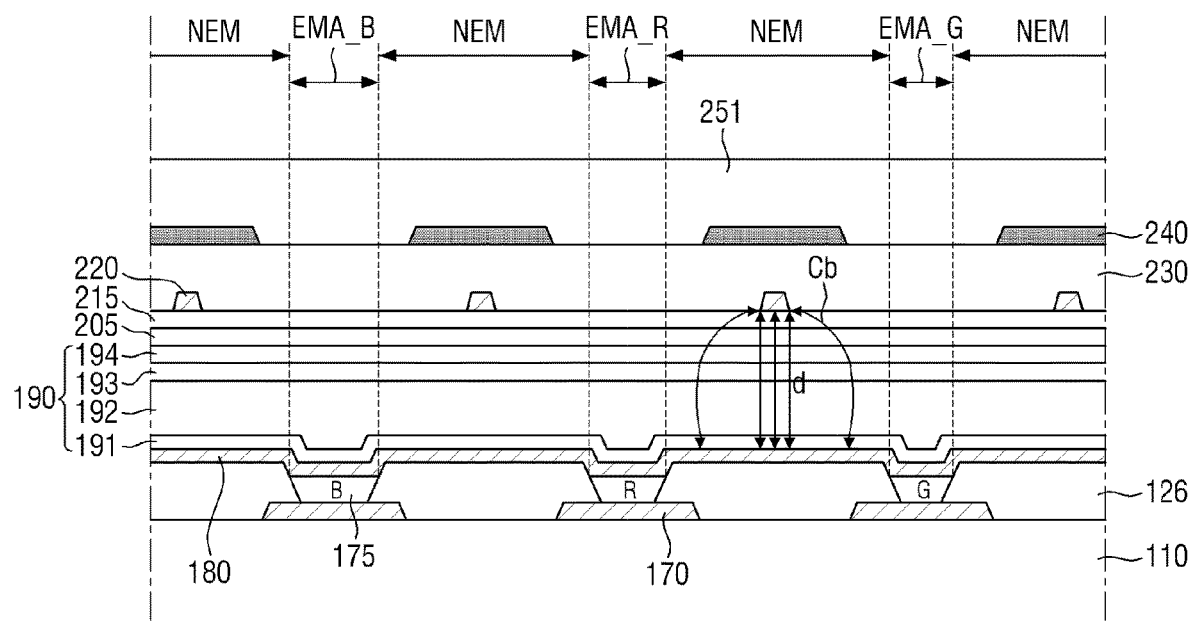
FIG. 9 is a cross-sectional view illustrating a parasitic capacitor formed between a second touch conductive layer and a common electrode of FIG. 8.
Figure 10:
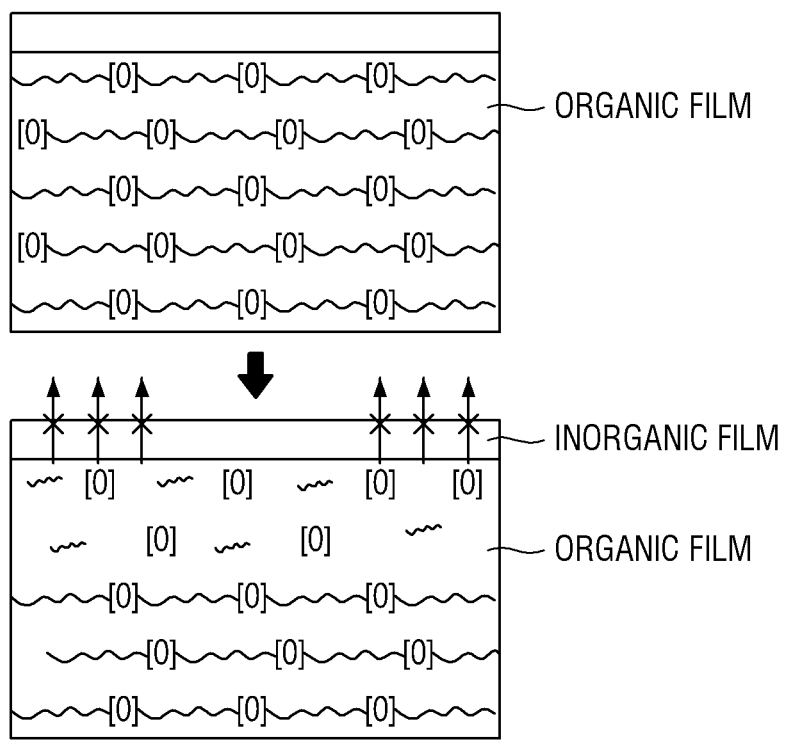
FIG. 10 illustrates the outgassing of an organic film of an encapsulation layer of the display device according to an embodiment of the present disclosure.
Figure 11:
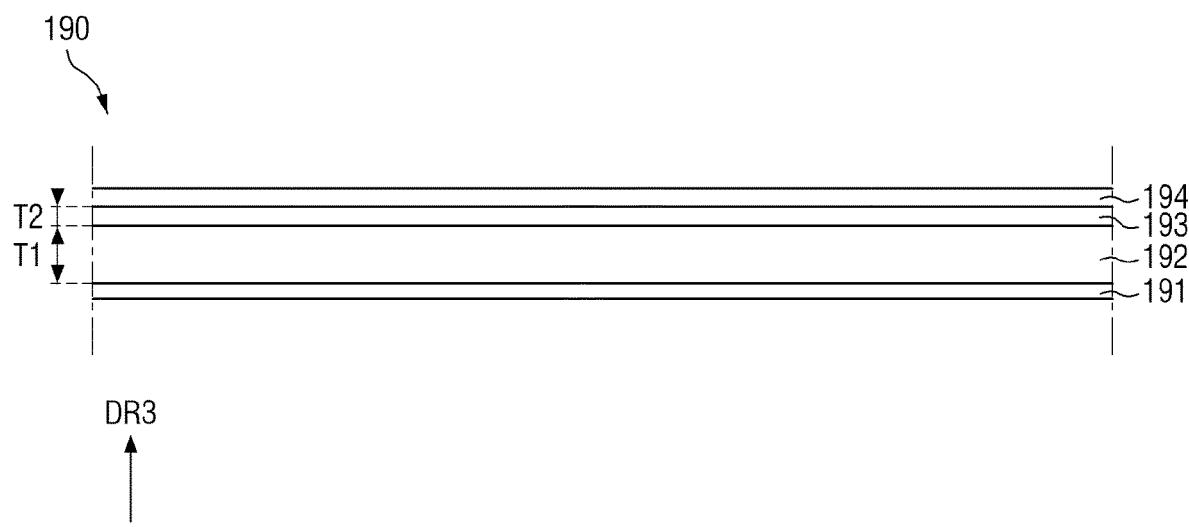
FIG. 11 is a cross-sectional view of the encapsulation layer of the display device according to an embodiment of the present disclosure.

FIG. 8 is a cross-sectional view taken along line I-I' of FIG. 7. FIG. 9 is a cross-sectional view illustrating a parasitic capacitor formed between a second touch conductive layer and a common electrode of FIG. 8. FIG. 10 illustrates the outgassing of an organic film of an encapsulation layer of the display device according to an embodiment of the present disclosure. FIG. 11 is a cross-sectional view of the encapsulation layer of the display device according to an embodiment of the present disclosure.

For convenience, most of the layers below first electrodes 170 are not illustrated in FIGS. 8 and 9, and instead, FIGS. 8 and 9 illustrate the structure above the organic light-emitting elements.

Referring to FIG. 8, the substrate 110 of the display device 1 may be formed of or include an insulating material such as a polymer resin. Examples of the polymer material include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, PI, polycarbonate ("PC"), cellulose triacetate ("CAT"), cellulose acetate propionate ("CAP"), and a combination thereof. The substrate 110 may be a flexible substrate that is bendable, foldable, or rollable. The substrate 110 may be formed of or include PI, but the present disclosure is not limited thereto.

The first electrodes 170 are disposed on the substrate 110. The first electrodes 170 are illustrated as being disposed directly on the substrate 110, but the circuit driving layer DRL, which includes a plurality of TFTs and signal lines, may be disposed between the substrate 110 and the first electrodes 170.

The first electrodes 170 may be pixel electrodes disposed in different pixels and may be anodes. The first electrodes 170 may have a structure in which a high-work function material layer formed of or including indium tin oxide (ITO), indium zinc oxide (IZO), zinc oxide (ZnO), or indium oxide ($In_2O_3$) and a reflective material layer formed of or including Ag, magnesium (Mg), Al, platinum (Pt), palladium (Pb), gold (Au), nickel (Ni), neodymium (Nd), iridium (Ir), chromium (Cr), lithium (Li), calcium (Ca), or a mixture thereof are stacked. The high-work function material layer may be disposed above the reflective material layer, close to organic layers 175. The first electrodes 170 may have a multilayer structure such as ITO/Mg, ITO/MgF, ITO/Ag, or ITO/Ag/ITO, but the present disclosure is not limited thereto.

The bank layer 126 may be disposed on the substrate 110. The bank layer 126 may define openings therein, which expose the first electrodes 170 from above the first electrodes 170. Due to the presence of the bank layer 126 and the openings, the emission areas EMA_R, EMA_G, and EMA_B and a non-emission area NEM may be defined. The bank layer 126 may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene ("BCB"). The bank layer 126 may include an inorganic material.

Light-emitting layers are disposed on parts of the first electrodes 170 exposed by the bank layer 126. The light-emitting layers may include the organic layers 175. The organic layers 175 may include organic light-emitting layers and may further include hole injection/transport layers and/or electron injection/transport layers.

A second electrode 180 may be disposed on the organic layers 175. The second electrode 180 may be a common electrode, which is disposed on the entire surface of the substrate 110 for all pixels. The first electrodes 170, the organic layers 175, and the second electrode 180 may form organic light-emitting elements together.

The second electrode 180 may be in contact not only with the organic layers 175, but also with the top surface of the bank layer 126. The second electrode 180 may be conformally formed to reflect any height difference in the structure disposed therebelow.

The second electrode 180 may include a low-work function material layer formed of or including Li, Ca, LiF/Ca, LiF/Al, Al, Mg, Ag, Pt, Pd, Ni, Au Nd, Ir, Cr, BaF, barium (Ba), or a compound or mixture thereof (e.g., the mixture of Ag and Mg). The second electrode 180 may further include a transparent metal oxide layer, which is disposed on the low-work function material layer.

An encapsulation layer 190, which includes a first inorganic layer 191, a first organic layer 192, a second organic layer 193, and a second inorganic layer 194, is disposed on the second electrode 180. The encapsulation layer 190 may be disposed between the second electrode 180 and the base layer 205.

The first and second inorganic layers 191 and 194 may include silicon nitride, silicon oxide, or silicon oxynitride.

As already mentioned above, the capacitance between the first sensor parts SP1/the second sensor parts SP2 and the conductive layers below the second touch conductive layer 220 may be lowered to enhance the touch sensitivity in each of the unit sensing areas SUT. The second electrode 180, which is the closest to the second touch conductive layer 220, may affect the level of touch sensitivity noise most considerably among other conductive layers below the second touch conductive layer 220.

A capacitance Cb between the second electrode 180 and the second touch conductive layer 220 (e.g., the first sensor parts SP1 and the second sensor parts SP2) in each of the unit sensing areas SUT may be proportional to the dielectric constant of an organic film between the second electrode 180 and the second touch conductive layer 220 in each of the unit sensing areas SUT. Thus, the organic film between the second electrode 180 and the second touch conductive layer 220 in each of the unit sensing areas SUT may preferably have a low dielectric constant.

Referring to FIG. 10, in order to form the encapsulation layer 190, an inorganic film may be formed on an organic film by plasma-enhanced chemical vapor deposition ("PECVD"). However, during PECVD, chemical bonds in the organic film may be broken, near the surface of the organic film, by plasma, and as a result, volatile gases may be generated. The volatile gases may not be able to be properly released and may thus appear as dark spot defects.

Referring to FIG. 11, the encapsulation layer 190 may include the first inorganic layer 191, the first organic layer 192, and the second inorganic layer 194 and may further include the second organic layer 193, which is disposed between the first organic layer 192 and the second inorganic layer 194 and is robust against plasma.

The first organic layer 192 may have a low dielectric constant to reduce the capacitance between the second electrode 180 and the second touch conductive layer 220 (i.e., the first sensor parts SP1 and the second sensor parts SP2) in each of the unit sensing areas SUT, i.e., the capacitance Cb. The first organic layer 192 may have a dielectric constant of about 2.0 to about 3.0. The first organic layer 192 may have a dielectric constant of about 3.0 or less and may thus lower the capacitance Cb.

The first organic layer 192 may include an unsaturated polyester resin or an acrylic resin. For example, the first organic layer 192 may include tetraethylene glycol dimethacrylate, tetradecyl methacrylate, or tetradecyl diacrylate.

As the first organic layer 192 is formed to have an elliptical organic molecular structure, the dielectric constant of the first organic layer 192 can be lowered, the capacitance Cb can be reduced, and the touch sensitivity of the display device 1 can be improved.

The second organic layer 193 may be disposed directly on the first organic layer 192 and may thus be in contact with the top surface of the first organic layer 192. The second organic layer 193 may protect the first organic layer 192 from plasma during the formation of the second inorganic layer 194. The second organic layer 193 may have high resistance to a plasma process. The plasma resistance of an organic film may be expressed using an Ohnishi parameter and a ring parameter.

The Ohnishi parameter may be represented by Equation (1):

$$\frac{N_{total}}{N_c - N_o} \tag{1}$$

where $N_{total}$ denotes the total number of atoms in a molecule of an organic film, $N_c$ denotes the number of carbon atoms in a molecule of the organic film, and $N_o$ denotes the number of oxygen atoms in a molecule of the organic film. The Ohnishi parameter may indicate the amount of oxygen in an organic film. The less the amount of oxygen in an organic film is, the less the amount of volatile gas generated by plasma is. That is, the less the Ohnishi parameter is, the higher the plasma resistance is.

The ring parameter may be represented by Equation (2):

$$\frac{\text{Mass of Carbon Atoms in Rings}}{\text{Total Mass of Component}}. \tag{2}$$

Equation (2) shows the mass of carbon atoms of a cyclic structure with respect to the total mass of all constituent atoms. The ring parameter may indicate the content of cyclic structures in an organic film. As a carbon ring (or cyclic structure) such as phenyl has a higher binding energy than a carbon chain, the greater the ring parameter is, the higher the plasma resistance is.

The second organic layer 193 may have a smaller Ohnishi parameter than the first organic layer 192. The second organic layer 193 may have a larger ring parameter than the first organic layer 192. The first organic layer 192 may have a ring parameter less than 0.15, and the second organic layer 193 may have a ring parameter of 0.15 or greater. The second organic layer 193 may have a larger dielectric constant than the first organic layer 192. As already mentioned above, the first organic layer 192 may have a dielectric constant of about 2.0 to about 3.0, and the second organic layer 193 may have a dielectric constant greater than 3.0.

The second organic layer 193 may include a compound expressed by Formula (1):

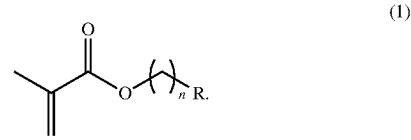

(1)

where n is a natural number of 4 or greater and R is a phenyl or phenoxy group.

The compound expressed by Formula (1) may be, for example, 2-phenoxyethyl acrylate. A structure obtained by bonding a phenyl ring to diacrylate may also be applicable to the second organic layer 193.

As the second organic layer 193 includes a phenyl ring having a higher binding energy in an organic molecular structure than a carbon chain, the plasma resistance of the second organic layer 193 can be enhanced. As a result, the first organic layer 192 can be prevented from being damaged during the formation of the second inorganic layer 194 on the second organic layer 193.

However, the present disclosure is not limited to this. Alternatively, various other compounds that meet the above-described Ohnishi parameter, ring parameter, and/or dielectric constant requirements may also be applicable to the second organic layer 193.

As described above, sufficient plasma resistance can be secured by forming a second organic layer 193 having a smaller Ohnishi parameter, but a greater ring parameter, than the first organic layer 192. Accordingly, damage to the first organic layer 192 that may be caused by plasma during the formation of the second inorganic layer 194 can be prevented, and the degradation of display quality such as dark spot defects can be effectively prevented.

To increase the plasma resistance of the second organic layer 193, the second organic layer 193 may be formed to have a thickness T2, which is in the range of 1% to 100% of a thickness T1 of the first organic layer 192 in the thickness direction (i.e., third direction DR3). Here, the thickness T2 of the second organic layer 193 is 1% or greater of the thickness T1 of the first organic layer 192, the plasma resistance of the second organic layer 193 can be improved. Also, if the thickness T2 of the second organic layer 193 is less than 100% of the thickness T1 of the first organic layer 192, the first organic layer 192 can prevent the capacitance between the second electrode 180 and the second touch conductive layer 220 (i.e., the first sensor parts SP1 and the second sensor parts SP2) in each of the unit sensing areas SUT, i.e., the capacitance Cb, from increasing.

The thickness T1 of the first organic layer 192 may be 1 micrometer (μm) to 10 μm, and the thickness T2 of the second organic layer 193 may be 0.01 μm to 10 μm. Alternatively, the thickness T1 of the first organic layer 192 may be 5 μm to 10 μm, and the thickness T2 of the second organic layer 193 may be 0.5 μm to 2 μm in the thickness direction (i.e., third direction DR3). However, the present disclosure is not limited to these examples.

Referring again to FIGS. 8 and 9, the base layer 205, the first touch insulating layer 215, the second touch conductive layer 220, and the second touch insulating layer 230 may be sequentially disposed on the thin-film encapsulation layer 190, and detailed descriptions thereof will be omitted. FIGS. 8 and 9 illustrate cross-sectional views of sensor parts, and the first touch conductive layer 210 is not illustrated in FIGS. 8 and 9.

The second touch conductive layer 220 may be disposed in the non-emission area NEM to overlap with the bank layer 126 in a plan view. As the second touch conductive layer 220 forms the mesh patterns MSP and does not overlap with the emission areas (EMA_R, EMA_G, and EMA_B), the second touch conductive layer 220 does not interfere with the emission of light and may thus be invisible to a user.

A light-blocking pattern 240 are disposed on the second touch insulating layer 230. The light-blocking pattern 240 may reduce the reflection of external light and may improve reflection colors. The light-blocking pattern 240 may be disposed in the non-emission area NEM. The light-blocking patterns 240 may have a lattice or lattice shape in a plan view. The light-blocking pattern 240, the first and second touch conductive layers 210 and 220, and the bank layer 126 may all be disposed in the non-emission area NEM and may overlap with one another in the thickness direction of the display panel 10. The width of the light-blocking pattern 240 may be less than, or the same as, the width of the bank layer 126 and may be greater than the width of the first and second touch conductive layers 210 and 220. The light-blocking pattern 240 may not overlap with the emission areas (EMA_R, EMA_G, and EMA_B) in a plan view.

An overcoat layer 251 may be disposed on the light-blocking pattern 240. The overcoat layer 251 may be disposed directly on the light-blocking pattern 240. The overcoat layer 251 may cover and protect the light-blocking pattern 240. The overcoat layer 251 may planarize the surface of the display device 1.

The display device 1 may include the second organic layer 193, which includes a compound having a phenyl ring structure with a high binding energy with respect to acrylate. Accordingly, the first organic layer 192 can be prevented from being damaged by plasma during the formation of the second inorganic layer 194, and as a result, the degradation of display quality such as dark spot defects can be effectively prevented.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
   a substrate;
   a first electrode disposed on the substrate;
   an organic light-emitting layer disposed on the first electrode;
   a second electrode disposed on the organic light-emitting layer;
   an encapsulation layer disposed on the second electrode; and
   a touch layer disposed on the encapsulation layer,
   wherein the encapsulation layer includes a first inorganic layer, a first organic layer, a second organic layer, and a second inorganic layer,
   wherein the first inorganic layer is disposed on the second electrode, the first organic layer is disposed on the first inorganic layer, the second organic layer is disposed on the first organic layer and has a greater ring parameter than the first organic layer, and the second inorganic layer is disposed on the second organic layer.

2. The display device of claim 1, wherein
   the second organic layer has a ring parameter of 0.15 or greater, and
   the first organic layer has a ring parameter less than 0.15.

3. The display device of claim 1, wherein the second organic layer has a greater dielectric constant than the first organic layer.

4. The display device of claim 3, wherein
   the first organic layer has a dielectric constant of 2.0 to 3.0, and
   the second organic layer has a dielectric constant greater than 3.0.

5. The display device of claim 1, wherein a thickness of the second organic layer is 1% to 100% of a thickness of the first organic layer.

6. The display device of claim 5, wherein
the first organic layer has a thickness of 1 micrometer (μm) to 10 μm, and
the second organic layer has a thickness of 0.01 μm to 10 μm.

7. The display device of claim 1, wherein
a bottom surface of the second organic layer is in contact with a top surface of the first organic layer, and
a top surface of the second organic layer is in contact with a bottom surface of the second inorganic layer.

8. The display device of claim 1, wherein the second organic layer includes a compound expressed by Formula 1:

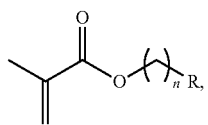

where n is a natural number of 4 or greater, and R is a phenyl or phenoxy group.

9. The display device of claim 8, wherein the compound includes 2-phenoxyethyl acrylate.

10. A display device comprising:
a substrate;
a first electrode disposed on the substrate;
an organic light-emitting layer disposed on the first electrode;
a second electrode disposed on the organic light-emitting layer; and
an encapsulation layer disposed on the second electrode, wherein
the encapsulation layer includes a first organic layer, a second organic layer, and an inorganic layer,
the second organic layer is disposed between the first organic layer and the inorganic layer, and
the second organic layer includes a compound expressed by Formula 1:

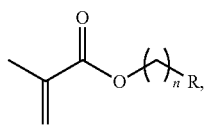

where n is a natural number of 4 or greater and R is a phenyl or phenoxy group.

11. The display device of claim 10, wherein the compound includes 2-phenoxyethyl acrylate.

12. The display device of claim 10, wherein the second organic layer has a greater ring parameter than the first organic layer.

13. The display device of claim 12, wherein
the second organic layer has a ring parameter of 0.15 or greater, and
the first organic layer has a ring parameter less than 0.15.

14. The display device of claim 10, wherein the second organic layer has a greater dielectric constant than the first organic layer.

15. The display device of claim 14, wherein
the first organic layer has a dielectric constant of 2.0 to 3.0, and
the second organic layer has a dielectric constant greater than 3.0.

16. The display device of claim 10, wherein a thickness of the second organic layer is 1% to 100% of a thickness of the first organic layer.

17. The display device of claim 16, wherein
the first organic layer has a thickness of 1 μm to 10 μm, and
the second organic layer has a thickness of 0.01 μm to 10 μm.

18. The display device of claim 10, wherein
a bottom surface of the second organic layer is in contact with a top surface of the first organic layer, and
a top surface of the second organic layer is in contact with a bottom surface of the inorganic layer.

19. A display device comprising:
a substrate;
a first electrode disposed on the substrate;
an organic light-emitting layer disposed on the first electrode;
a second electrode disposed on the organic light-emitting layer; and
an encapsulation layer disposed on the second electrode, wherein
the encapsulation layer includes a first organic layer, a second organic layer, and an inorganic layer,
the second organic layer is disposed between the first organic layer and the inorganic layer,
the second organic layer has a greater dielectric constant than the first organic layer, and
the second organic layer has a dielectric constant greater than 3.0.

20. The display device of claim 19, wherein the first organic layer has a dielectric constant of 2.0 to 3.0.

* * * * *